Figure 1:
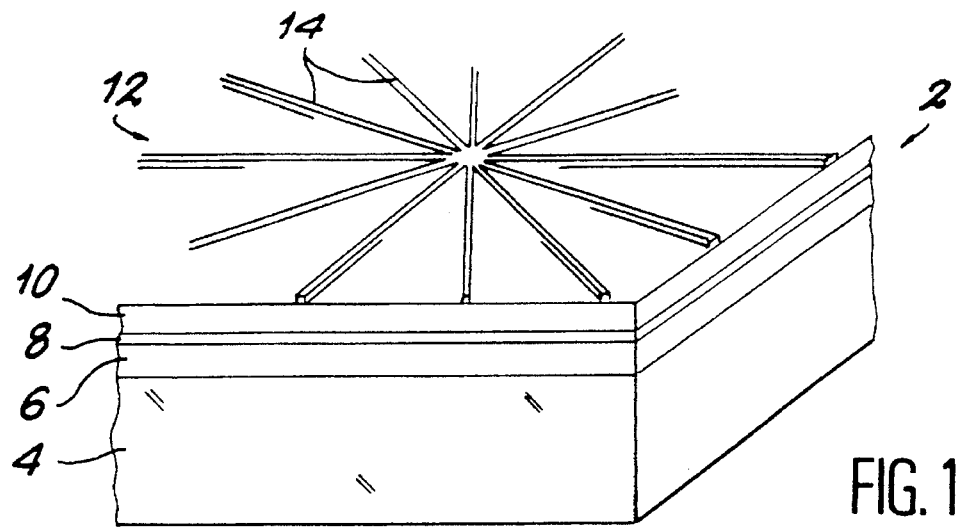
Figure 1:
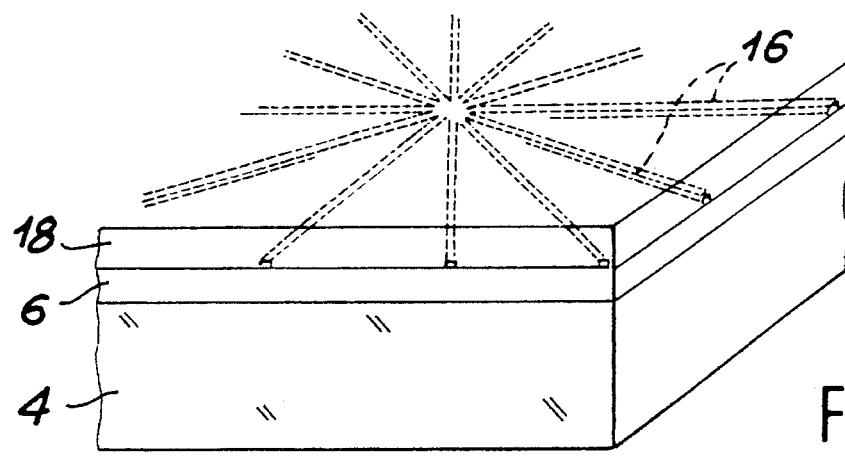
Figure 1:
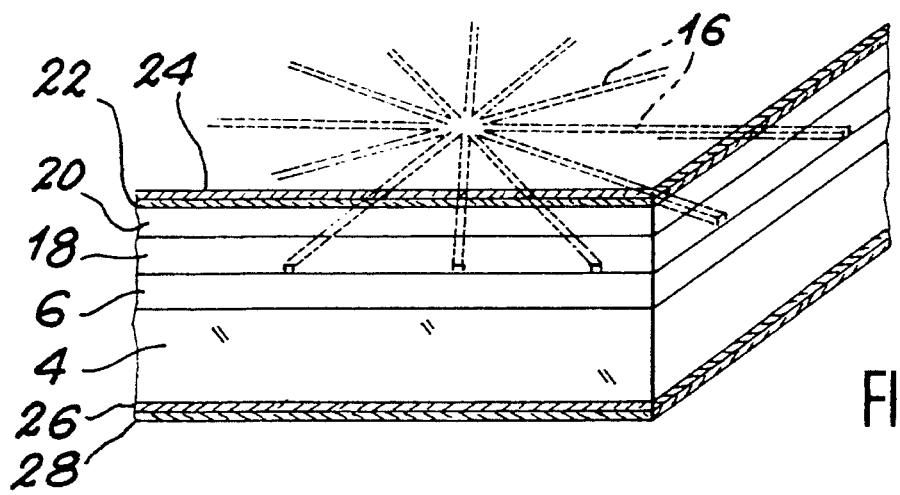
Figure 1D:
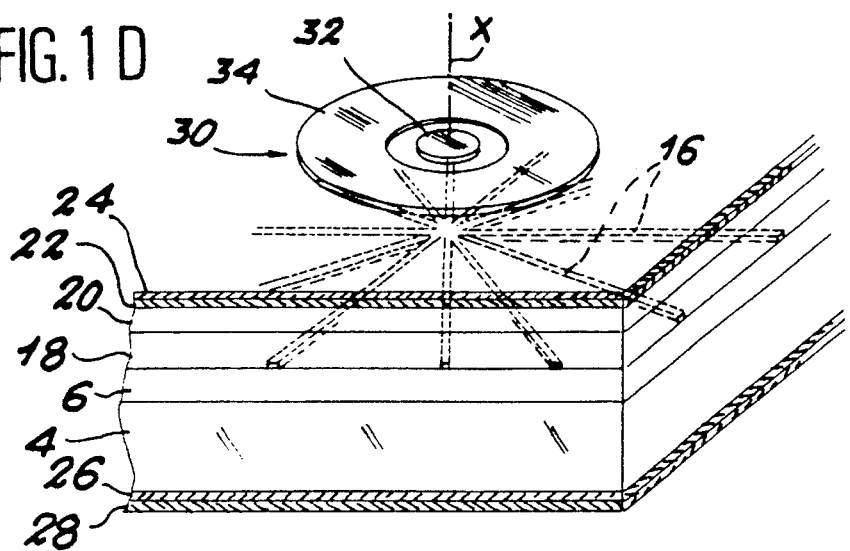
Figure 1E:
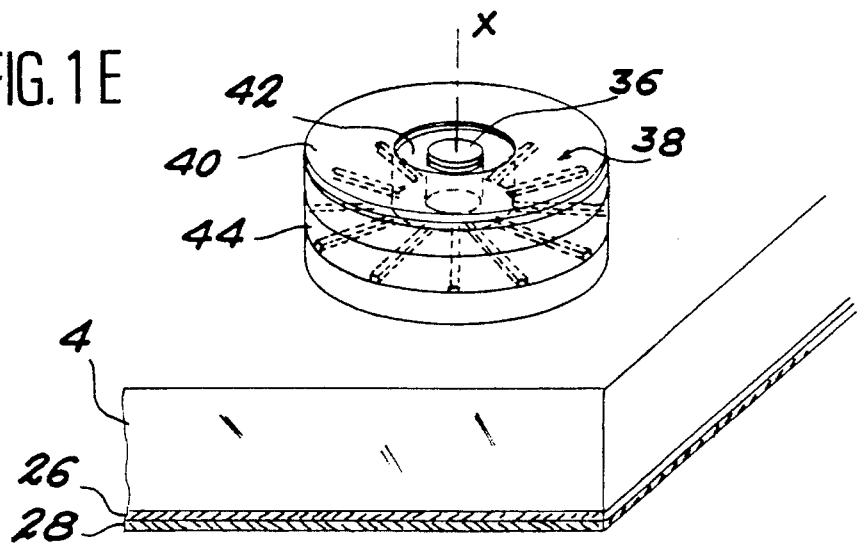

United States Patent [19]

Bouadma et al.

[11] Patent Number: 5,548,610
[45] Date of Patent: Aug. 20, 1996

[54] SURFACE-EMITTING POWER LASER AND PROCESS FOR FABRICATING THIS LASER

[75] Inventors: Nouredine Bouadma, Gentilly; Louis Menigaux, Bures Sur Yvett, both of France

[73] Assignee: France Telecon, Issy Les Moulineaux, France

[21] Appl. No.: 854,215

[22] Filed: Mar. 6, 1992

[30] Foreign Application Priority Data

Mar. 13, 1991 [FR] France .................................. 91 03022

[51] Int. Cl.$^6$ ................................ H01S 3/10; H01S 3/18
[52] U.S. Cl. .............................. 372/99; 372/94; 372/102; 372/43
[58] Field of Search .............................. 372/94, 99, 102, 372/43

[56] References Cited

U.S. PATENT DOCUMENTS

| 4,649,351 | 3/1987 | Veldkamp et al. | 359/349 |
| 4,894,835 | 1/1990 | Uomi et al. | 372/45 |
| 4,958,357 | 9/1990 | Kinoshita | 372/96 |
| 4,971,415 | 11/1990 | Hara et al. | 359/349 |
| 5,115,445 | 5/1992 | Mooradian | 372/75 |

FOREIGN PATENT DOCUMENTS

| 0228088 | 7/1987 | European Pat. Off. . |
| 0369856 | 5/1990 | European Pat. Off. . |

OTHER PUBLICATIONS

Patent Abstracts of Japan vol. 13, No. 578 (E–864) (3926) 20 Dec. 1989 & JP–A–01 241 885 (NEC) 26 Sep. 1989.
Patent Abstracts of Japan, vol. 12, No. 425 (E–681)(3272), 10 Nov. 1988 & JP–A–63 164 387 (Matsushita) 7 Jul. 1988.
Patent Abstracts of Japan vol. 13, No. 346 (E–798)(3694) 3 Aug. 1989 & JP–A–01 105 590 (Toshiba) 24 Apr. 1989.
Patent Abstracts of Japan vol. 13, No. 352 (E–801) 8 Aug. 1989 & JP–A–01 110 781 (NEC) 27 Apr. 1989.
Patent Abstracts of Japan vol. 16, No. 59 (E–1166) 14 Feb. 1992 & JP–A–03 257 888 (Kokusai Denshi Denwa) 18 Nov. 1991.
"Surface–emitting GaAs/AlGaAs Lasers with Dry–etched 45° Total Reflection Mirrors", Hamao et al., Appl. Phys. Lett. 54 (24) 12 Jun. 1989.
"Ultrahigh Power 38 W Continuous–Wave Monolithic Laser Diode Arrays", Sakamoto et al., Appl. Phys. Lett. 52 (26) 27 Jun. 1988.
"Surface–emitting GaInAsP/InP Laser With Low Threshold Current and High Efficiency", Liau et al., Appl. Phys Lett. 46 (2), 15 Jan. 1985.
Electronics Letters, vol. 26, No. 7, 29 Mar. 1990, pp. 422–424.
Electronics Letters, vol. 23, No. 3, 29 Jan. 1987 pp. 130–131.
Electronics Letters, vol. 22, No. 8, 10 Apr. 1986, pp. 438–439.
"45°–Mirror Surface–Emitting Diode Lasers and High Power Arrays", Liau et al., MIT, 18B1–1 (Invited), p. 18–19.
"Single–Mode Behavior of a Circular Grating for Potential Disk–Shaped DFB Lasers", M. Toda, *IEEE Journal of Quantum Electronics*, vol. 26, No. 3, Mar. 1990.
"Grating Coupled Surface Emitters" Welch et al., Spectra Diode Labs., pp. 6–7.

*Primary Examiner*—Nelson Moskowitz
*Attorney, Agent, or Firm*—Kerkam, Stowell, Kondracki & Clarke, P.C.; Edward J. Kondracki

[57] ABSTRACT

The present invention relates to a surface-emitting power laser, this laser comprises, on a semiconducting substrate, a plurality of elementary semiconductor stripe lasers, and means for reflecting along a direction perpendicular to the substrate, light generated by each of the elementary lasers.

9 Claims, 5 Drawing Sheets

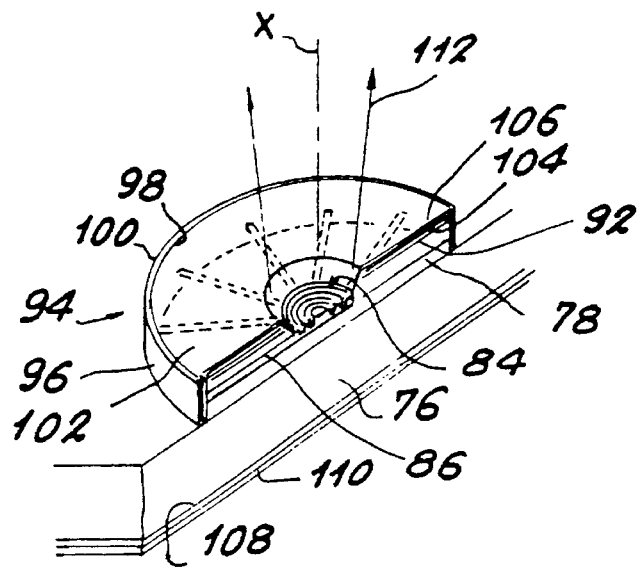
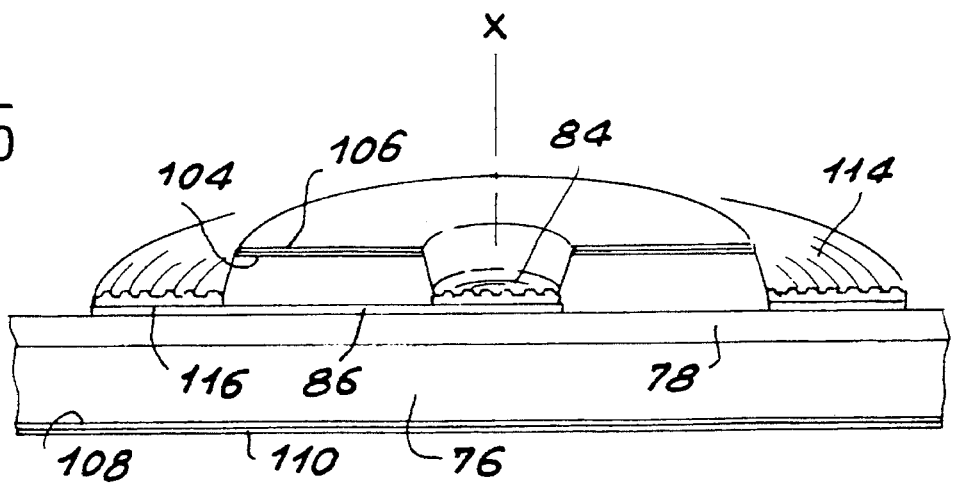
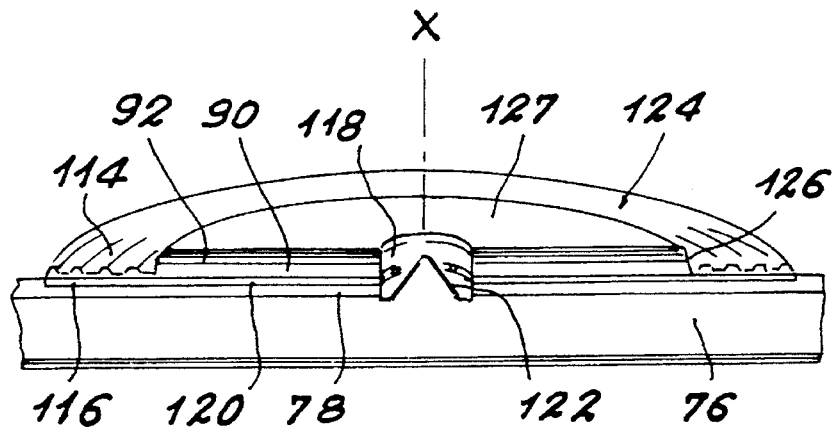

SURFACE-EMITTING POWER LASER AND PROCESS FOR FABRICATING THIS LASER

DESCRIPTION

The present invention relates to a surface-emitting power laser, this laser comprising, on a semiconductor substrate, a plurality of elementary semiconductor stripe lasers, and means for reflecting, along a direction perpendicular to the substrate, the light generated by each of the elementary lasers.

The present invention also relates to a process for fabricating the laser forming the subject of this invention.

The invention is applicable to various fields, in particular to the following fields: optical telecommunications (transmission by optical fibers), compact discs, optical recording, optical interconnections between integrated circuits or between computers, pumping of solid lasers.

Surface-emitting lasers are already known from various documents.

These documents form a part of documents (1) to (12) which are cited at the end of the present description and to which reference will be made.

A surface-emitting laser having a vertical cavity is known from document (1).

The Fabry-Perot cavity of this laser is formed by two surfaces of an epitaxial layer.

The light is then extracted vertically.

This laser is characterized by being difficult to employ and having a low power and a circular beam.

A surface-emitting laser having a horizontal cavity is known from document (2).

The surface-emitting of this laser is obtained by a grating etched in the structure in which the laser (DBR or DFB) is produced.

This laser is characterized by a limited yield, a narrow beam along one direction and a possibility of coherence in two dimensions.

Another surface-emitting laser having a horizontal cavity is known from documents (3) and (4).

The surface-emitting of this laser is obtained with the aid of a 45° deflector.

This laser is characterized by a compatibility with conventional structures and by a beam whose quality depends on the quality of the laser mirror and of the 45° deflector.

A surface-emitting laser having a horizontal cavity and inclined mirrors is also known from document (5).

The cavity of this laser is therefore horizontal but one of the mirrors of the laser is inclined in such a way that the light generated in the laser is reflected towards the surface.

This laser is characterized by a high threshold and a reduced power.

In some fields, such as telecommunications in space between satellites or the cutting of material by laser beams, it is known to use gas lasers or solid lasers which are capable of supplying the high luminous powers necessary in these fields.

It has already been envisaged, in the latter, to use surface-emitting semiconductor lasers as well as power lasers.

Now, the structures known from documents (1) to (5), as well as trench-emitting semiconductor lasers, do not enable luminous powers greater than a few tens of milliwatts to be reached.

In fact, by considering, for example, a stripe laser diode, enlargement of this stripe ("stripe" according to Anglo-Saxon terminology) leads to a self-focusing which renders the emission mode of the laser unstable.

In order to overcome this drawback, and therefore to obtain power lasers, it has already been envisaged to produce linear or two-dimensional (that is to say having a matrix structure) arrays of laser diodes.

Several stripes which may be coupled by their evanescent lateral fields, or not coupled, are then integrated on the same substrate.

It has thus been possible to reach a total luminous power (equal to the sum of the luminous output powers of the lasers of the array) of a few watts, even of a few tens of watts.

Examples of such laser diode arrays are mentioned in documents (2), (6), (7), (8) and (9).

The analysis of the characteristics of the various known structures, which comprise trench-emitting or surface-emitting laser diode arrays (diodes coupled or not coupled), shows that, despite the high luminous powers reached, none of these structures makes it possible to obtain a high luminous power which is distributed within a single beam which is stable (that is to say without fluctuation of luminous power over the course of time) and narrow.

In fact, the radiation diagram of these known structures is multilobe and generally has as many lobes as laser diodes.

Even in the case where the laser diodes are coupled by evanescent fields, the luminous emission is generally multimode, which corresponds to the simultaneous presence of several modes of oscillation.

The object of the present invention is to overcome the drawbacks which these known arrays of laser diodes have.

The invention solves the following problem: to find a surface-emitting semiconductor power laser structure which is capable of supplying a substantially monolobe luminous beam which is substantially circular and is narrower and more stable than the luminous beams supplied by knbwn arrays which have been mentioned hereinabove.

In order to solve this problem, the surface-emitting power laser, which forms the subject of the present invention, is characterized by the fact that the stripes of the elementary lasers which it comprises are disposed along radii of a circle whose axis is parallel to this direction and that the reflection means are provided for reflecting, along this axis, the light generated by each of the elementary lasers.

According to a first particular embodiment of the power laser which is the subject of the invention, the reflection means comprise a reflector substantially in the form of a cone of revolution whose half-angle at the apex has the value of 45° and whose axis is coincident with the axis of the said circle and the ends of the stripes, which are located to the side of this axis, are facing the reflector.

In a particular embodiment of the invention, comprising this reflector, the assembly of the elementary lasers is delimited by an internal wall and by an external wall which are substantially cylindrical by revolution about the said axis, the internal wall surrounds the reflector and each of the elementary lasers has feedback means which comprise a portion of the internal wall and a portion of the external wall.

In another particular embodiment of the invention, also comprising this reflector, the assembly of the elementary lasers is delimited by an internal wall and by an external wall, the internal wall is substantially cylindrical by revolution about the said axis and surrounds the reflector, the power laser furthermore comprises a peripheral circular diffraction grating whose axis is the axis of the said circle, which surrounds the external wall and beneath which the stripes of the elementary lasers are joined together, and each of these elementary lasers has feedback means which comprise a portion of the internal wall and a portion of the peripheral circular diffraction grating.

According to a second particular embodiment of the power laser which is the subject of the invention, the reflection means comprise a central circular diffraction grating whose axis is coincident with the axis of the said circle and beneath which the stripes of the elementary lasers are joined together.

In one particular embodiment of the invention, comprising this central circular diffraction grating, the assembly of the elementary lasers is delimited by an internal wall and by an external wall, the internal wall surrounds the central circular diffraction grating, the external wall is substantially cylindrical by revolution about the said axis and each of the elementary lasers has feedback means which comprise a portion of the central circular diffraction grating and a portion of the external wall.

In another particular embodiment of the invention, also comprising the central circular diffraction grating, the assembly of the elementary lasers is delimited by an internal wall and by an external wall, the power laser furthermore comprises a peripheral circular diffraction grating whose axis is the axis of the circle, which surrounds the external wall and beneath which the stripes of the elementary lasers are joined together, the internal wall surrounds the central circular diffraction grating and each of the elementary lasers has feedback means which comprise a portion of the central circular diffraction grating and a portion of the peripheral circular diffraction grating.

Preferably, in the particular embodiments of the invention comprising the central circular diffraction grating, the elementary lasers are not facing each other.

In other words, no elementary laser stripe is aligned with another elementary laser stripe.

In fact, if the elementary lasers were facing each other, this could result in optical instabilities.

According to a preferred embodiment of the power laser which is the subject of the invention, the elementary lasers are double-heterostructured semiconductor lasers.

It is known, in fact, that a double heterostructure leads to threshold current densities very much lower than those which arise from simple heterostructures.

The present invention also relates to a process for fabricating a surface-emitting laser, in which process there are formed, on a semiconductor substrate:

a plurality of elementary stripe semiconductor lasers, and means for reflecting, along a direction perpendicular to the substrate, the light generated by each of the elementary lasers, this process being characterized in that the stripes of the elementary lasers are formed by a dry etching technique, along radii of a circle whose axis is parallel to this direction, and in that the reflection means are formed in such a way that they are capable of reflecting, along this axis, the light generated by each of the elementary lasers.

According to a first particular method of implementing the process which is the subject of the invention, there are formed firstly the stripes of the elementary lasers then, by a dry etching technique, internal and external walls which are substantially cylindrical by revolution about the said axis, which delimit the assembly of the elementary lasers and which form the feedback means of these elementary lasers, then, also by a dry etching technique, a reflector substantially in the form of a cone of revolution whose half-angle at the apex has the value of 45°, which constitutes the reflection means, whose axis is coincident with the axis of the said circle and which is surrounded by the internal wall.

According to a second particular implementation method, there are formed, firstly, the stripes of the elementary lasers then, by a etching technique by means of a focused ion beam, there are formed, on the one hand, an internal wall and a reflector during one step and, on the other hand, an external wall during another step, these internal and external walls being substantially cylindrical by revolution about the said axis, delimiting the assembly of the elementary lasers and forming the feedback means of these elementary lasers, the reflector being substantially in the form of a cone of revolution whose half-angle at the apex has the value of 45°, constituting the reflection means, having an axis coincident with the axis of the said circle and being surrounded by the internal wall.

Preferably, in the first and second particular embodiments, there are furthermore formed, respectively on the reflector and on the said external wall, dielectric layers and then metallic layers which are provided for increasing the reflectivity respectively of this reflector and of this external wall.

According to a third particular method of implementing the process which is the subject of the invention, there are formed, firstly, on the substrate, a confinement layer, then an active layer and then a guiding layer whose refractive index is less than the refractive index of the active layer, there is formed, subsequently, from the guiding layer, a central circular diffraction grating whose axis is coincident with the axis of the said circle, there are formed, subsequently, from the active layer, the stripes of the elementary lasers in such a way that these Stripes surround the central circular diffraction grating, and there is formed, subsequently, by etching, an external wall which delimits the periphery of the assembly of the elementary lasers, which is substantially cylindrical by revolution about the said axis and which forms, with the central circular diffraction grating, the feedback means of these elementary lasers.

In this case, there are preferably formed furthermore, on the said external wall, a dielectric layer and then a metallic layer which is provided for increasing the reflectivity of this external wall.

Finally, according to a fourth particular method of implementing the process which is the subject of the invention, there are formed, firstly, on the substrate, a confinement layer, then an active layer and then a guiding layer whose refractive index is less than the refractive index of the active layer, there are formed, subsequently, from the guiding layer, a central circular diffraction grating and a peripheral circular diffraction grating which surrounds the central circular diffraction grating, gratings whose respective axes are coincident with the axis of the said circle and which are separated from each other, there are formed, subsequently, from the active layer, the stripes of the elementary lasers in such a way that these stripes surround the central circular diffraction grating and are surrounded by the peripheral circular diffraction grating, the latter forming, with the central circular diffraction grating, the feedback means of the elementary lasers.

Figure 3:
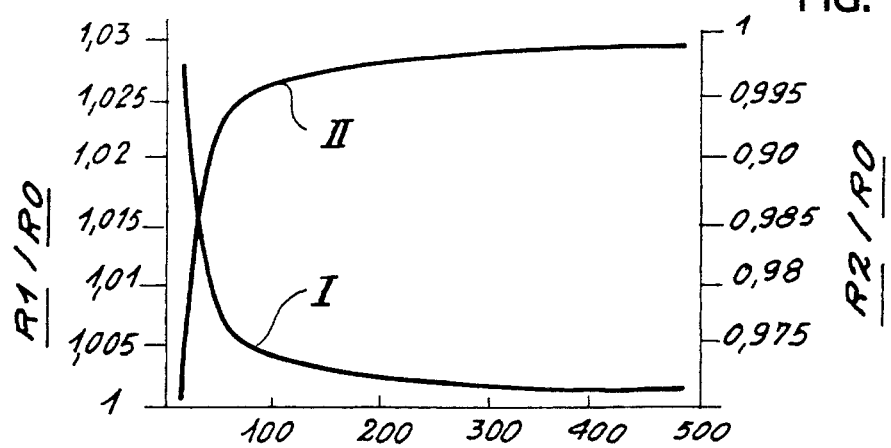
Figure 1F:
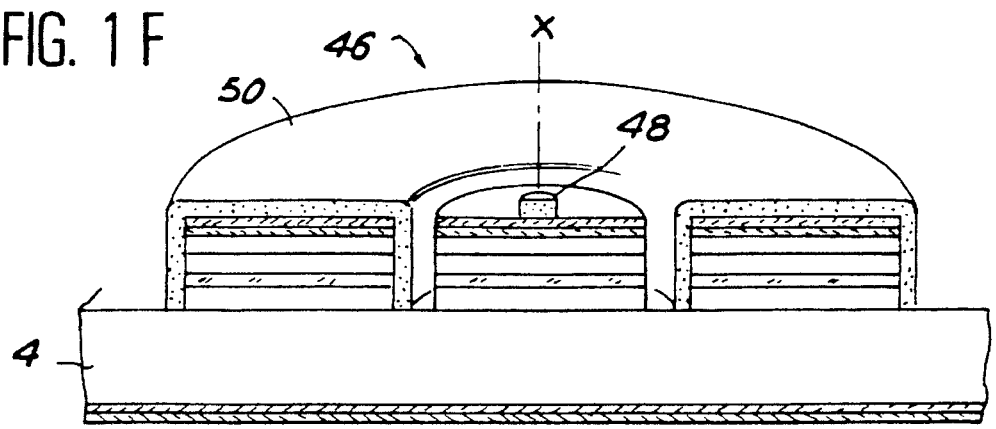
Figure 1G:
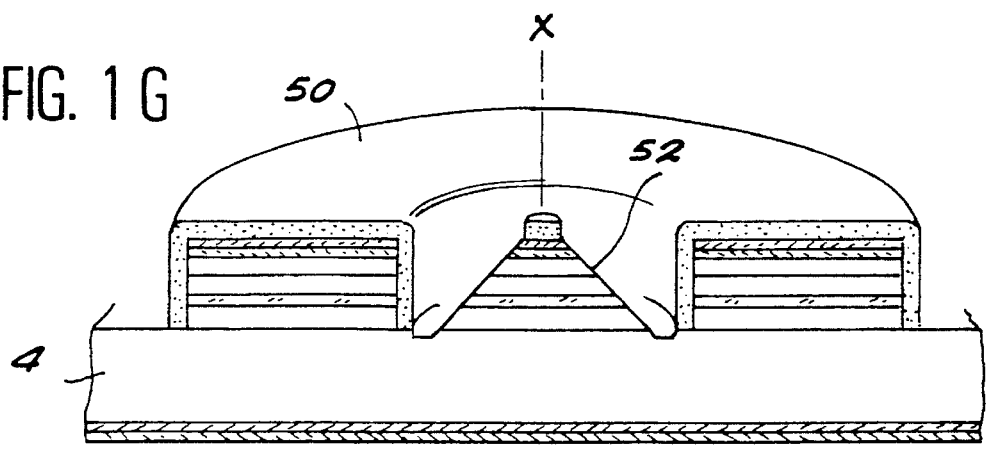
Figure 1H:
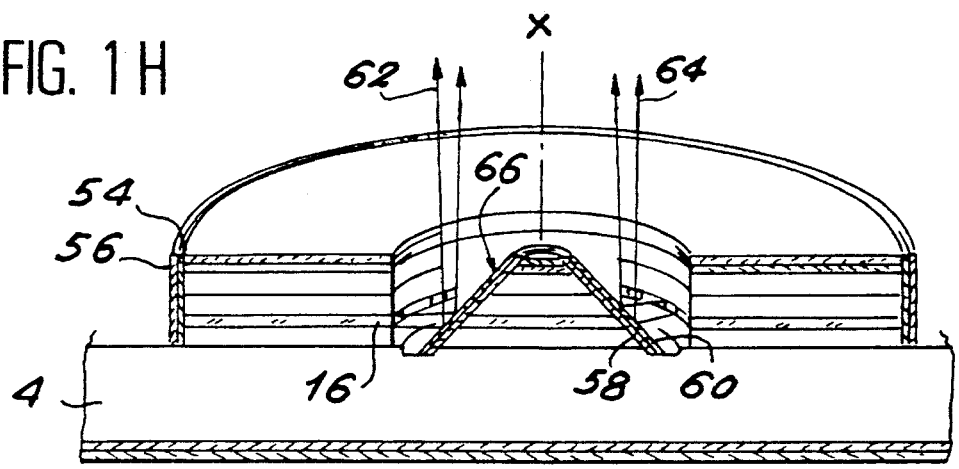
Figure 2:
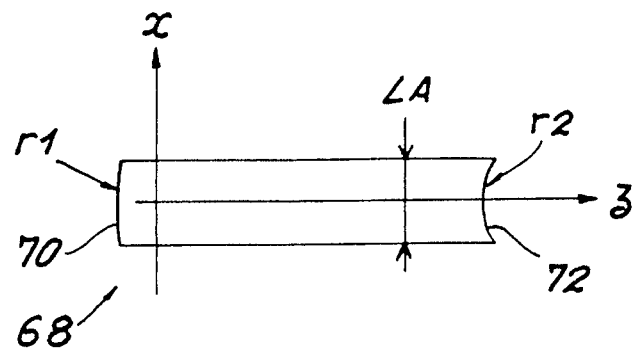

The present invention will be better understood by reading the description of exemplary embodiments which are given hereinbelow purely by way of indication in a non-limiting manner, with reference to the attached drawings in which:

FIGS. 1A to 1H illustrate diagrammatically various steps of a process for fabricating a first particular embodiment of the surface-emitting power laser which is the subject of the invention, FIG. 2 illustrates diagrammatically and partially an elementary laser forming a part of the power laser shown in FIG. 1, FIG. 3 shows reflectivity curves relating to the elementary laser of FIG. 2, FIGS. 4A to 4D illustrate diagrammatically various steps of a process for fabricating a second particular embodiment of the surface-emitting power laser which is the subject of the invention, FIG. 5 is a diagrammatic view of a third particular embodiment of this surface-emitting power laser, and FIG. 6 is a diagrammatic view of a fourth particular embodiment of this surface-emitting power laser.

The lasers in accordance with the invention may be double-heterostructured lasers.

The double heterostructure may comprise a stack of layers made of an alloy of the type $Ga_{1-x}Al_xAs$ (in order to obtain a light emission between 0.8 micrometer and 0.9 micrometer) or made of an alloy of the type $Ga_{1-x}In_xAs_{1-y}P_y$ (in order to obtain a light emission between 1.3 micrometers and 1.5 micrometers).

These layers are produced on a substrate made of GaAs or made of InP, for example by one of the following epitaxial processes:
liquid phase epitaxy,
gas phase epitaxy,
molecular beam epitaxy,
chemical beam epitaxy.

It would be possible, of course, to use any other technique enabling an epitaxial stacking to be produced.

Of course, the parameter x or the parameters x and y mentioned hereinabove are suitably chosen for the various layers in such a way as to obtain, effectively, heterostructures.

Each of the power lasers in accordance with the invention which are described hereinbelow by way of example is an assembly of elementary lasers, each of these elementary lasers comprising an optical cavity in the form of a stripe.

The surface-emitting may be obtained by reflection of the luminous beams generated by the elementary lasers, in a direction perpendicular to the plane defined by the axes of the elementary cavities, via a conical reflector inclined at 45° with respect to this plane or via a circular diffraction grating (DBR), this conical reflector or this circular diffraction grating being etched in the semiconductor structure common to the elementary lasers and being located facing the elementary lasers.

In addition, the feedback means of the elementary lasers may be mirrors which are etched in the semiconducting structure common to the elementary lasers and which delimit the optical cavities of these elementary lasers.

This is the case in the laser in accordance with the invention which is described with reference to FIGS. 1A to 1H.

In other lasers in accordance with the invention, the simultaneous feedback of the elementary lasers is obtained, on the one hand, by a central circular diffraction grating which is etched in the center of the semiconducting structure common to the elementary lasers and whose function is also the deflection, perpendicular to the surface, of the light generated by these elementary lasers, and on the other hand, by a mirror-face which is etched on the perimeter of the said semiconducting structure, which is the case for the laser in accordance with the invention which is described with reference to FIGS. 4A to 4D, or by a peripheral circular diffraction grating which is formed on the perimeter of this semiconducting structure and which has the same axis as the central circular diffraction grating, which is the case in the laser in accordance with the invention which is described with reference to FIG. 5.

In document (10) the reflectivities and the resonance conditions are calculated for a DFB structure which uses a circular diffraction grating.

Reference will also be made to document (11).

The various lasers in accordance with the invention, the obtaining of which is explained hereinbelow, may be double-heterostructured lasers
of the GaAs/GaAlAs type
of the InP/InGaAsP type
or even of the GaAs/InGaAsP type,
or of any other semiconductor material capable of laser effect.

There will now be described a process enabling a laser in accordance with the invention to be obtained, reference being made to FIGS. 1A to 1H.

For the implementation of this process, firstly a double heterostructure 2 (FIG. 1A) is produced by successively depositing, by liquid phase epitaxy or by vapor phase epitaxy or even by molecular beam epitaxy, on a substrate 4 made of $n^+$-doped InP:
a first confinement layer 6 made of n-doped InP,
an active layer 8 made of InGaAsP, not intentionally doped, and
a protective layer 10 made of p-doped InP.

Subsequently, the array of stripes of the laser is produced according to a radial architecture.

These stripes may be:
of the buried type with a view to obtaining a BH structure ("Buried Heterostructure") or a BRS structure ("Buried Ridge Stripe") for example,
or of the "Ridge" type.

The example described with reference to FIGS. 1A to 1H relates to a BRS structure.

The etching technique by a wet chemical route, commonly used for laser structures oriented along the <100> or <1$\overline{1}$0> crystallographic directions cannot be used, in the present case, for structures oriented along intermediate directions because of the dependence of the etched profile on the direction and because of the difficulties of cleaving the material along the intermediate directions.

This is why, in order to fabricate the stripes with a radial architecture, a process of etching by a dry route is used, for example:
Ion Beam Etching (IBE)
or Reactive Ion Beam Etching (RIBE)
or even Reactive Ion Etching (RIE).

Such dry etching processes, which lead to etches which are not dependent on the orientation, are processes adapted to the production of lasers in accordance with the present invention, not only as regards the array of stripes of such lasers but also as regards the mirrorfaces, the circular diffraction gratings or the deflector which these lasers may comprise.

In the example described with reference to FIGS. 1A to 1H, the following procedure is carried out for producing buried stripes according to a radial architecture.

The heterostructure obtained 2 is masked, by means of a photosensitive resin, in such a way as to form, over the protective layer 10, a pattern 12 of this resin.

This resin pattern 12 comprises a plurality of straight segments 14 which have one end in common.

The axis of the power laser, the fabricate of which is explained, is perpendicular to the surface of the layer 10 and passes via the end common to the segments.

It is understood that a stripe can thus be made, from the active layer 8, beneath each segment 14.

The number of stripes formed is equal to the number of segments 14 of the pattern 12.

After having formed this pattern 12, a dry etching, for example of the RIBE type, of the heterostructure thus masked is carried out, as far as the first confinement layer 6.

An array of active stripes 16 (Figure 1B) is then obtained from the active layer 8 thus etched.

This etching is carried out in a support frame equipped with a Kaufman-type ion source or a cyclotronic ion source, or ECR source ("Electron Cyclotronic Resonance"), or an RF source.

As etching gases, a mixture of argon, hydrogen and methane is used for example, it being possible for this mixture to etch InP, GaAs and compounds of the latter.

It is known that any etching process by a dry route is characterized by the creation, in the etched material, of defects induced by the accelerated ionic beam and that the thickness of disturbed material is proportional to energy of this beam.

This is why, after the etching of the heterostructure 2, a slight chemical attack is carried out, that is to say of short duration (of the order of 5 seconds), of the structure thus etched, in a nonselective solution whose proportions by volume are:

IBr(1)HBr(17)H$_2$O(35)I(1):H$_2$O(2), at 2° C.

An inspection of the photoluminescence of the stripes obtained is then carried out in order to ensure that the etching is of good quality.

The resin mask 12 is subsequently removed.

The removal of this mask poses a problem.

In fact, the use of a hydrocarbon-based reactive gas, as for example methane, enables a semiconductor material such as InP to be etched. On the other hand, during the etching, a polymer deposition occurs on all material other than InP or the derivatives of the latter, especially on the resin mask, which renders this mask difficult to remove with typical solvents, such as acetone for example.

The use of an oxygen plasma for the removal enables this problem to be solved but, unfortunately, a loss of photoluminescence of InP and of the quaternary compound InGaAsP has been observed each time such a process for removing the resin has been used.

In order to overcome this drawback and to remove the resin mask 12 simply, without damaging the surface of the etched heterostructure, in the example described, a solution of hydrofluoric acid is used in an ultrasonic bath, this taking two minutes.

The next step is to clean, using conventional techniques, the surface of the etched heterostructure.

In order to do this, a hot cleaning of this surface is first carried out, successively in trichlorethylene, acetone and isopropanol, this taking two minutes for each of these substances, then a slight etching (for one minute) of this surface is carried out in sulfuric acid and this etching is followed by a deoxidation in hydrofluoric acid for 30 seconds.

A second epitaxy cycle, called "epitaxy repeat", is subsequently carried out, for example by an organometallic vapor phase deposition technique (or MOCVD, for "MetalOrganic Chemical Vapor Deposition") in order to cause the etched structure to grow:

a second confinement layer 18 made of p-doped InP (for example to $2\times10^{18}$ cm$^{-3}$ by zinc atoms), which buries the active stripes:

then a contact layer 20 made of p$^+$-doped InGaAs on this second confinement layer 18 (FIG. 1C).

The doping of the contact layer 20 is, for example, carried out with zinc atoms to $1\times10^{19}$ cm$^{-3}$.

Subsequently, the sole of the substrate 4 is thinned down and then the "p" and "n" sides of the structure obtained are metallized:

on the contact layer 20 are deposited a platinum layer 22 and then, on the latter, a gold layer 24, after an annealing at 450° C. for 2 mn, and on the "rear" face of the thinned-down substrate 4 (the face which is opposite that which carries the first confinement layer 6) are deposited a titanium layer 26 and then, on the latter, a gold layer 28.

On the surface of the structure formed (that is to say on the gold layer 24 deposited on the platinum layer 22) there is subsequently formed a mask 30 of photosensitive resin, or a tri-layer mask (FIG. 1D), which comprises the following patterns:

a disk 32 of small diameter, which corresponds to the conical reflector formed subsequently and whose axis X is perpendicular to the surface of the structure on which the mask 30 is formed and passes via the end common to the previously formed laser-stripes 16, and a ring 34 whose axis is the axis X of this disk 32 and which is delimited by an inner circle and by an outer circle whose respective projections, on the plane of the laser-stripes 16, parallel to the axis X, meet these laser-stripes.

The inner circle and the outer circle correspond to the internal mirror-face and to the external mirror-face respectively of the power laser, the obtaining of which faces will now be explained.

After having formed the mask 30, etching is carried-out, through this mask 30 and as far as the substrate 4, of:

the gold layer 24, the subjacent platinum layer 22 and the semiconducting layers which are located beneath this platinum layer 22.

In order to do this, the IBE technique is employed, with a neutral gas such as argon, or the RIBE technique, on a rotating sample holder (not shown) on which is placed, of course, the substrate on which is formed, by epitaxy, the double heterostructure, the latter carrying the mask 30, and this sample holder is oriented in such a way that the ion beam involved in the technique used forms an angle of incidence making it possible to obtain etched faces which are "vertical" (that is to say parallel to the axis X of the structure) and homogeneous over the entire etched sample.

A structure is thus obtained which comprises (FIG. 1E):

a central portion 36 which matches the form of a cylinder of revolution about the axis X and a portion 38 in the form of a torus, of rectangular cross section, whose axis is also the axis X and which is delimited by a "horizontal" face 40 (perpendicular to the axis X), an internal cylindrical face 42 (parallel to the axis X) and an external cylindrical face 44 (parallel to the axis X).

The mask 30, comprising the disk 32 and the ring 34, is then removed.

Subsequently (FIG. 1F), on the patterns which have just been etched, is formed another mask 46 of photosensitive resin or another tri-layer mask, this other mask 46 comprising:

a pattern 48 in the form of a disk whose axis is the axis X and which partially covers the upper face of the said central portion 36 obtained by the previous etching, and a pattern 50 which covers the said "horizontal" face 40 in the form of a ring, the said internal face 42 and the said external face 44 which are obtained by this previous etching, as is seen in FIG. 1F.

Subsequently, an etching of the structure thus masked is carried out, by the IBE technique or by the RIBE technique, at an ion beam angle of incidence enabling the cylindrical central portion 36 to be transformed into a portion 52 (FIG. 1G) substantially in the form of a cone of revolution whose half-angle at the apex equals 45° (and which therefore also forms—seen in cross section—an angle equal to 45° with the plane of the laser-stripes 16).

Of course, this is carried out by causing the structure on the rotary sample holder (not shown) to rotate, so as to obtain the portion 52 substantially in the form of a cone.

It will be noted that the simultaneous fabrication of a "vertical" face and of another face which is inclined, as is explained in the document (12), is not possible in the example which is being described, given that the symmetry of revolution (about the axis X) of the component to be etched dictates that the latter be placed on a sample holder rotating about its axis during the etching.

After having obtained the portion 52 substantially in the form of a cone, the resin mask 46 is removed.

In order to produce the said internal 42 and external 44 faces and the portion 52 substantially in the form of a cone, it is possible to use, instead of two successive etchings which require, as has just been seen, two successive maskings, the technique of etching by focused ion beam (or FIBE, for "Focused Ion Beam Etching").

This FIBE technique has the advantage of not requiring masking.

In addition, with this FIBE technique, there are obtained simultaneously:

the portion 52 substantially in the form of a cone which corresponds to the reflector of the power laser which is in the process of being produced and the internal face 42 and the external face 44 which correspond to the feedback mirrors of the elementary lasers (respectively associated with the stripes 16).

To be precise, when this FIBE technique is used:

the portion 52 substantially in the form of a cone and, simultaneously, the internal face 42 are first etched and the external face 44 is subsequently etched, by causing the sample holder to rotate about its axis (parallel to the axis X), the sample holder being oriented in such a way that its axis makes an angle of 45° with the axis of the ion beam.

In the case where the FIBE technique is used, it is possible, of course, to reverse the order of the operations:

the external face 44 is first formed and the portion 52 substantially in the form of a cone and the internal face 42 are subsequently formed, simultaneously.

The formation of the laser is subsequently completed.

In order to do this, a dielectric layer 54 and then a metallic layer 56 are deposited on the external face 44 (electrically insulated from the gold layer 24 by virtue of the dielectric layer 54).

After which, a dielectric layer 58 and then a metallic layer 60 are also deposited on the wall of the portion 52 substantially in the form of a cone.

It is possible to proceed in the reverse order by depositing:

the dielectric layer 58 and then the metallic layer 60 on the wall of the portion 52 substantially in the form of a cone, then the dielectric layer 54 and subsequently the metallic layer 56 on the external face 44.

The metallization of this external face 44 enables its reflectivity to be increased and thus the feedback means of the elementary lasers to be improved.

The metallization of the wall of the portion 52 substantially in the form of a cone enables:

the reflectivity of this wall (which forms the reflector of the laser) to be increased, and also the thermal heating effects which occur when this laser operates to be diminished.

The dielectric layers 54 and 58 may be:

silica layers or silicon nitride layers.

The metallic layers 56 and 60 may be:

gold layers or aluminum layers.

In addition, the thickness of the dielectric layers 54 and 58 is chosen to be equal to e, with:

$$e=L/(4.N)$$

where:

L is the emission wavelength of the power laser formed and

N is the refractive index of the material of the stripes 16 of the elementary lasers which this laser comprises.

The depositions of the dielectric layers 54 and 58 and of the metallic layers 56 and 60 may be carried out, for example, by electron-gun sputtering.

It is seen in FIG. 1H that the power laser obtained comprises an assembly of elementary stripe lasers, these stripes being adjacent and disposed around the axis X, in a plane perpendicular to this axis X.

This assembly of lasers is delimited by an internal face, parallel to the axis X, and by an external facet parallel to this axis X.

In each of the elementary lasers, the feedback is obtained by a resonant cavity, the resonant cavities being delimited by the said internal and external faces (which are parallel).

The laser beams such as the beams 62 and 64, which are simultaneously emitted by the elementary lasers, are reflected towards the surface of the power laser, along a direction perpendicular to the plane of the stripes, by virtue of the conical reflector 66 which has been etched in the center of the laser and towards which all the luminous beams generated by the elementary lasers converge (when a suitable electrical voltage is applied between the electrodes which constitute the gold layers 24 and 28).

The power laser thus emits a circular beam, substantially monolobe, which is constituted by the combination of the various luminous beams reflected by the reflector 66.

It will be noted that the choice of the number of stripes depends, inter alia, on the total luminous power which it is desired to generate.

FIG. 2 illustrates schematically, in plan view, one of the elementary lasers which bears the reference 68.

This elementary laser is delimited by an external mirror-face 70 and an internal mirror-face 72.

As has been seen, the combination of the external mirror-faces of the various elementary lasers constitutes the said external face of the power laser and the combination of the internal mirror-faces constitutes the said internal face of this laser.

None of these mirror-faces is plane.

Each internal mirror-face is curved towards the inside of the corresponding elementary laser while each external mirror-face is curved towards the outside of this elementary laser.

The characteristics of each elementary laser, in particular the threshold current and the optical yield, depend essentially on the radius of curvature r1 of the external mirror-face and on the radius of curvature r2 of the internal mirror-face of this elementary laser. It is possible to study the influence of the profile of the mirror-faces on the threshold current of the elementary laser.

The designations are made:

R1, for the reflectivity of the mirror-face of radius of curvature r1,

R2, for the reflectivity of the mirror-face of radius of curvature r2 and

R0, for the reflectivity of a mirror-face which would be plane.

It is possible to write:

$$Ri/R0 = Ai + Bi \quad (i=1 \text{ or } 2)$$

with $$Ai = \left(\int_{-\infty}^{+\infty} u0(x)^2 \cos(2b\phi i(x)) dx\right)^2$$

$$Bi = \left(\int_{-\infty}^{+\infty} u0(x)^2 \sin(2b\phi i(x)) dx\right)^2$$

$$u0(x) = (pi \cdot w)^{-1/4} \exp(-0.5(x/w)^2)$$

$$\phi i(x) = ri(1 - (1 - (x^2/ri^2))^{1/2})$$

In the above formulae:

$u0(x)$ is the distribution of the fundamental mode, assumed to be Gaussian, b is the propagation constant of the mode, w is the width at half-height of the luminous beam issuing from the elementary laser ("spot size"), and pi represents the well known number having approximately the value of 3.14.

In FIG. 2, the axis z is the propagation axis of the light of the elementary laser 68 and the axis x is perpendicular to the axis z and is located in the plane of the stripes of the elementary lasers.

In FIG. 3, there are traced the variations in the ratio R1/R0 (curve I) and the variations in the ratio R2/R0 (curve II) as a function of the corresponding radius of curvature (r1 or r2).

An elementary laser has been studied whose width LA (see FIG. 2) is equal to 2 micrometers.

It is observed that the reflectivity R1 is greater than that of the plane mirror-face, becomes a maximum when the radius of curvature r1 tends towards 0 and diminishes on tending towards R0 when the radius of curvature r1 tends towards infinity.

However, the range of variation in the reflectivity R1 remains sufficiently low (of the order of 3 to 4%) to result in only a small variation in the losses by the corresponding mirror-face (a few cm$^{-1}$) and therefore in the threshold current.

A strictly converse behavior is observed for the reflectivity R2, which is less than R0 and which becomes a minimum when the radius of curvature r2 tends towards 0.

It is therefore observed that the external mirror-face of the elementary laser, of convex profile, has a reflectivity R1 greater than R0 and that the internal mirror-face, of concave profile, has a reflectivity R2 less than R0.

For conventional elementary laser lengths (of the order of 300 micrometers), r2 is greater than r1, R2 is much nearer to R0 than R1 is and the equivalent reflectivity Req of the two mirror-faces is slightly less than R0.

By way of example, when r1 is equal to 25 micrometers and r2 is equal to 325 micrometers, the relative deviation between R2 and R1 is of the order of 2%.

FIGS. 4A to 4D illustrate diagrammatically various steps of a process making it possible to obtain a second particular embodiment of the laser which is the subject of the invention.

Figure 4:
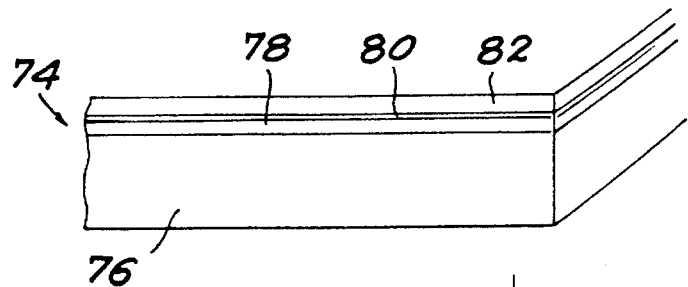
Figure 4:
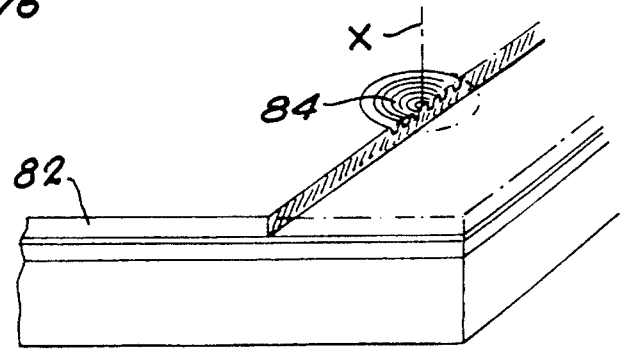
Figure 4:
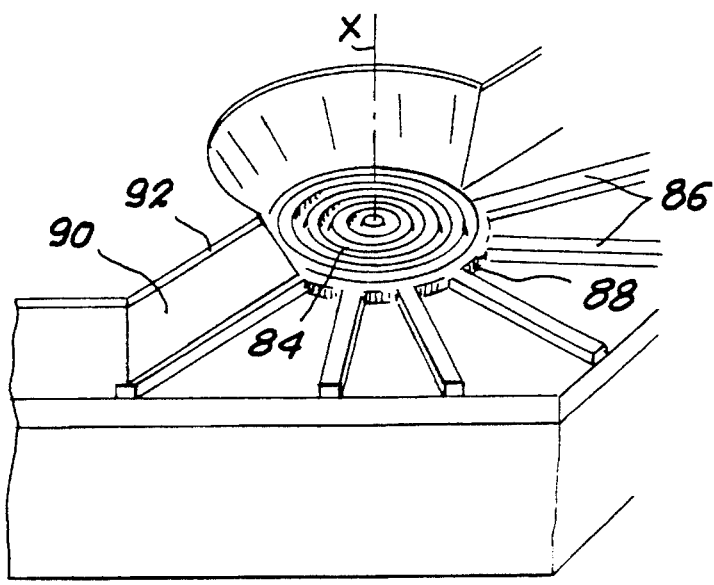

As is seen in FIG. 4, the starting point is a semi-double heterostructure 74 which is fabricated by successively depositing, by epitaxy, on a substrate 76 made of n$^+$-doped InP:

a first confinement layer 78 made of n-doped InP, an active layer 80 made of:

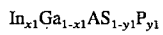

$$In_{x1}Ga_{1-x1}As_{1-y1}P_{y1}$$

a guiding layer 82 made of:

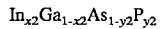

$$In_{x2}Ga_{1-x2}As_{1-y2}P_{y2}$$

The values x2 and y2 are chosen, with respect to the values x1 and y1, in such a way that the refractive index of the guiding layer 82 is less than the refractive index of the active layer 80.

A central circular diffraction grating 84 (Figure 4B) is subsequently produced in the guiding layer 82, by using a dry etching (electronic masking or FIBE technique).

Subsequently, the entire portion of the guiding layer 82, which surrounds the circular diffraction grating 84 which has just been formed, is removed.

In order to do this, it is possible to proceed by a chemical route (and it is then necessary to mask the circular diffraction grating 84 formed).

The active layer 80 is thus caused to appear around the circular diffraction grating 84.

The laser-stripes 86 (FIG. 4C) are subsequently formed by dry etching of this active layer 80.

An assembly of stripes 86 is thus obtained in the form of segments issuing from a disk 88 of active layer, which is located beneath the circular diffraction grating 84 formed.

The axis of this disk is the axis X of the laser which is in the process of being formed.

All the stripes 86 are located on straight lines which meet at this axis X.

The stripes 86 are preferably produced in such a way that none of them is in the prolongation of another stripe and, for this purpose, an odd number of stripes may be used.

After having formed the stripes, an epitaxy repeat is performed by depositing, over the entire surface of the structure obtained, a layer 90 of p-doped InP and, on the latter, a contact layer 92 made of p$^+$-doped InGaAs.

The circular diffraction grating 84 is subsequently made to reappear by a technique of etching by a chemical route in solution or by a dry etching technique of the layer 90 made of p-doped InP and of the contact layer 92.

Subsequently, the semiconducting layers are etched as far as the substrate 76 by a dry route (Figure 4D) in such a way as to form, around the grating 84, a structure 94 in the form of a torus whose axis is the axis X of the grating 84 and which is delimited on the outside by an external face 96 which is "vertical", that is to say parallel to this axis X.

This external face 96 will form, as will be seen by the following, the external mirror-face of the elementary lasers of the laser which is in the process of being fabricated, thus ensuring, with the circular diffraction grating 84, the feedback of these elementary lasers.

In each elementary laser, the feedback is therefore obtained by a portion of this mirror-face and by a portion of the grating 84.

Of course, the etching leading to the external face 96 is carried out in such a way that this external face 96 meets all the laser-stripes 86 which have been formed previously.

Subsequently, as has been indicated already hereinabove, a dielectric layer 98 and then a metallic layer 100 are deposited on this external face 96.

The next step is as follows:
the sole of the substrate is thinned down,
a platinum layer 104 and then a gold layer 106 are deposited on the upper face 102 in the form of a ring of the previously formed toric structure 94 and
a titanium layer 108 and then a gold layer 110 are also deposited on the lower face of the substrate 76 (the face opposite that which carries the toric structure 94).

The deposition of the layers 104 and 106 is performed in such a manner that the layers 104 and 106 are not in contact with the metallic layer 100.

A power laser in accordance with the invention is thus obtained and may be seen in FIG. 4D.

The luminous beam 112, which is produced by such a laser, is circular and is constituted by the superposition of the luminous beams issuing from the various elementary lasers.

These beams are transmitted, parallel to the axis X, by the circular diffraction grating 84 which contributes not only to the feedback in the elementary lasers but also to the reflection of the luminous beam 112 parallel to the axis X.

Another laser in accordance with the invention is shown diagrammatically in FIG. 5.

Again, a central circular diffraction grating 84 is used whose axis is the axis X of this other laser for the reflection, parallel to this axis X, of the luminous beam generated by this other laser and for the feedback of the elementary lasers which this other laser comprises.

In the case of FIG. 5, the feedback is obtained, furthermore, by virtue of a peripheral circular diffraction grating 114 in the form of a ring, whose axis is the axis X of the central circular diffraction grating 84.

Thus, use is no longer made, for the feedback, of a peripheral "vertical" mirror-face such as that used in the case of the laser of FIG. 4D.

In order to fabricate the laser shown in FIG. 5, use is made of a process which is similar to the process described with reference to FIGS. 4A to 4D.

The starting point is the same semi-double heterostructure 74.

The central circular diffraction grating 84, in the form ef a disk of axis X, and the peripheral circular diffraction grating 114, in the form of a ring, are subsequently produced in the guiding layer, these gratings being coaxial.

The remainder of the guiding layer 82 (outside these gratings 84 and 114) is subsequently removed.

The stripes 86 are produced by dry etching of the active layer 80, hence an active layer remainder composed of a central disk 88, of a peripheral ring 116 and of the stripes 86 which connect the disk 88 to the ring 116 and which are located on straight lines passing through the axis X.

As previously, it is preferable for none of these stripes to be aligned with another stripe.

The epitaxy repeat is subsequently carried out and then the two gratings 84 and 116 are revealed.

Finally, the sole of the substrate 76 is thinned down and a platinum layer 104 and then a gold layer 106 are deposited on the upper face, in the form of a ring, of the toric structure obtained and a titanium layer 108 and then a gold layer 110 are deposited on the "lower" face of the substrate.

In FIG. 6, another power laser in accordance with the invention has been shown diagrammatically.

In the laser of FIG. 6, the reflection, parallel to the axis X, is ensured by virtue of a reflector substantially in the form of a cone of axis X, whose half-angle at the apex has the value of 45°.

The feedback is ensured:
by an internal mirror-face 118 and
a circular diffraction grating 114 in the form of a ring, located at the periphery of the laser.

In this laser, each of the stripes of the elementary lasers may be aligned with another stripe, as was the case in FIG. 1H.

In order to produce the laser of FIG. 6, the procedure is as follows:
the starting point is the semi-double heterostructure 74,
the peripheral circular diffraction grating 114 in the form of a grating is fabricated,
the portion of the guiding layer which is surrounded by this grating 114 is removed,
the stripes 120 of the elementary lasers are fabricated in such a way that they all meet at the axis X of the laser which is in the process of being formed and that they leave this axis X radially in order to end up at the remainder 116 of the active layer, in the form of a ring, located beneath the peripheral circular diffraction grating 114,
the epitaxy repeat is carried out over the entire surface of the structure obtained,
the internal mirror-face 118 in the form of a cylinder of revolution about the axis X is produced,
a portion 122 substantially in the form of a cone of axis X and of half-angle at the apex equal to 45°, facing the stripes 120, is produced,
on this portion 122 are deposited the dielectric layer then a metallic layer, hence the reflector substantially in the form of a cone, and
the peripheral circular diffraction grating 114 is caused to reappear by eliminating the layers located above it by dry etching, which causes a structure 124, substantially toric about the axis X, to appear, this structure surrounding the reflector and being surrounded by the grating 114 and thus being delimited by the wall 118 and by an external wall 126,
the sole of the substrate 76 is thinned down,
a platinum layer 98 and then a gold layer 100 are deposited on the upper face 127, in the form of a ring, of the structure 124 which surrounds the reflector and which is surrounded by the peripheral circular diffraction grating 114,
a titanium layer 108 and then a gold layer 110 are deposited on the lower face of the substrate 76.

The documents mentioned in the present description are the following:
(1) Microcavity GaAlAs/GaAs surface-emitting laser with $I_{th}$=6 mA, K. IGA, S. KINOSHITA, F. KOYAMA, Electronics Letters, 29 Jan. 1987, vol. 23, No. 3, p. 134 to 136.
(2) Grating coupled surface emitters, D. F. Welch, R. Parke, A. Hardy, R. Waarts, W. Streifer and D. R. Scifres, presented at IOOC 89, KOBE, Japan, paper No. 18B2-5(PD).

(3) Surface-emitting GaAlAs/GaAs laser with etched mirrors, J. J. YANG, M. JANSEN and M. SERGANT, Electronics Letters, 10 Apr. 1986, vol. 22, No. 8, p.438 and 439.
(4) Surface-emitting GaInAsP/InP laser with low threshold current and high efficiency, Z. L. Liau and J. N. Walpole, Appl. Phys. Lett, 46(2), 15 Jan. 1985, p. 115 to 117.
(5) Surface-emitting GaAs/AlGaAs lasers with dry-etched 45° total reflection mirrors, N. Hamao, M. Sugimoto, N. Takado, Y. Tashiro, H. Iwata, T. Yuasa and K. Asakawa, Appl. Phys. Lett, 54(24), 12 Jun. 1989, p. 2389 to 2391.
(6) Ultrahigh power 38W continuous-wave monolithic laser diode arrays, M. Sakamoto, D. F. Welch, G. L. Harnagel, W. Streifer, H. Kung and D. R. Scifres, Appl. Phys. Lett, 52(26), 27 Jun. 1988, p. 2220 to 2221.
(7) Performance characteristics of high power cw, 1 cm wide monolithic AlGaAs laser diode arrays with a 2 mm total aperture width, M. Sakamoto, M. R. Cardinal, J. G. Endriz, D. F. Welch, D. R. Schifres, Electronics Letters, 29 Mar. 1990, vol. 26, No. 7, p. 422 to 424.
(8) 45° -Mirror Surface-Emitting Diode Lasers and High-Power Arrays, Z. L. Liau, J. N. Walpole, J. P. Donnelly, K. Rauschenbach, V. Diadiuk, W. D. Goodhue, C. A. Wang, R. J. Bailey, L. J. Missagia and D. E. Mull, Report at IOOC'89, 18–21 Jul. 1989, KOBE, Japan, paper No. 18B1-1.
(9) 300 mW Operation of a Surface-Emitting Phase-Locked Array of Diode Lasers, J. Puretz, R. K. De Freez, R. A. Elliott, J. Orloff and T. Paoli, Electronics Letters, 29 Jan. 1987, vol. 23, No. 3, p. 130 and 131.
(10) Single-Mode Behavior of a Circular Grating for Potential Disk-Shaped DFB Lasers, Minoru Toda, IEEE Journal of Quantum Electronics, vol. 26, No. 3, March 1990, p. 473 to 481.
(11) US-A-4,743,083 (Schimpe)
(12) FR-A-2 562 339 (Nouredine Bouadma), see also US-A-4,865,684.

We claim:

1. A surface-emitting power laser comprising, on a semiconductor substrate (4, 76),
   a plurality of elementary semiconductor lasers (68), having a plurality of strips (16, 86, 120), and
   means (66, 84, 122) for reflecting, along a direction perpendicular to the substrate, the light generated by each of the elementary lasers (68), the power laser being characterized by the fact that the strips (16, 86, 120) of the elementary lasers (68) are disposed along radii of a circle whose axis (X) is parallel to said direction of reflection and in that the reflection means (66, 84, 122) are provided in order to reflect, along said axis (X), the light generated by each of the elementary lasers (68).

2. Power laser according to claim 1, characterized in that the reflection means comprise a reflector (66) substantially in the form of a cone of revolution having a half-angle at the apex of 45° and an axis coincident with the axis (X) of the said circle and in that the ends of the strips (16), situated to the side of this axis (X), face the reflector.

3. Power laser according to claim 2, characterized in that the assembly of the elementary lasers (68) is delimited by an internal wall (42) and by an external wall (44) which are substantially cylindrical by revolution about the said axis (X), in that the internal wall (42) surrounds the reflector (66) and in that each of the elementary lasers (68) has feedback means which comprise a portion of the internal wall (42) and a portion of the external wall (44).

4. Power laser according to claim 2, characterized in that the assembly of the elementary lasers (68) is delimited by an internal wall (118) and by an external wall (126), in that the internal wall (118) is substantially cylindrical by revolution about the said axis (X) and surrounds the reflector (122), in that the power laser furthermore comprises a peripheral circular diffraction grating whose axis is the axis (X) of the said circle, which surrounds the external wall (126) and beneath which the stripes (120) of the elementary lasers (68) are joined together and in that each of these elementary lasers (68) has feedback means which comprise a portion of the internal wall (118) and a portion of the peripheral circular diffraction grating (114).

5. Power laser according to claim 1, characterized in that the reflection means comprise a central circular diffraction grating (84) whose axis is coincident with the axis (X) of the said circle and beneath which the stripes (86) of the elementary lasers (68) are joined together.

6. Power laser according to claim 5, characterized in that the assembly of the elementary lasers (68) is delimited by an internal wall and by an external wall (96), in that the internal wall surrounds the central circular diffraction grating (84), in that the external wall (96) is substantially cylindrical by revolution about the axis (X) and in that each of the elementary lasers (68) has feedback means which comprise a portion of the central circular diffraction grating (84) and a portion of the external wall (96).

7. Power laser according to claim 5, characterized in that the assembly of the elementary lasers (68) is delimited by an internal wall and by an external wall, in that the power laser furthermore comprises a peripheral circular diffraction grating (114) whose axis is the axis (X) of the circle, which surrounds the external wall and beneath which the stripes (86) of the elementary lasers (68) are joined together, in that the internal wall surrounds the central circular diffraction grating (84) and in that each of the elementary lasers (68) has feedback means which comprise a portion of the central circular diffraction grating (84) and a portion of the peripheral circular diffraction grating (114).

8. Power laser according to any one of claims 5 to 7, characterized in that no strip (86) of an elementary laser (68) is aligned with another elementary laser strip.

9. Power laser according to any one of claims 1 to 7, characterized in that the elementary lasers (68) are double-heterostructured semiconductor lasers.

* * * * *